United States Patent
Amorosa et al.

(10) Patent No.: US 10,594,263 B2
(45) Date of Patent: Mar. 17, 2020

(54) COMMON-MODE LOOP CONTROLLED FULLY-DIFFERENTIAL ADAPTIVE CLASS-A AMPLIFIER

(71) Applicant: STMicroelectronics (Grenoble 2) SAS, Grenoble (FR)

(72) Inventors: Flavia Amorosa, Fontanil-Cornillon (FR); Serge Ramet, Jarrie (FR); Daniel Subiela, Fontanil-Cornillon (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 15/983,287

(22) Filed: May 18, 2018

(65) Prior Publication Data
US 2019/0356271 A1    Nov. 21, 2019

(51) Int. Cl.
| H04B 1/10 | (2006.01) |
| H03F 1/02 | (2006.01) |
| H03F 3/45 | (2006.01) |
| H03F 3/19 | (2006.01) |
| H04L 27/14 | (2006.01) |

(52) U.S. Cl.
CPC .............. *H03F 1/0205* (2013.01); *H03F 3/19* (2013.01); *H03F 3/45179* (2013.01); *H04B 1/1027* (2013.01); *H04L 27/14* (2013.01); *H03F 2200/171* (2013.01); *H03F 2200/294* (2013.01); *H03F 2200/451* (2013.01); *H03F 2203/45526* (2013.01); *H03F 2203/45544* (2013.01)

(58) Field of Classification Search
CPC ...... H03F 1/0205; H03F 3/19; H03F 3/45179; H04B 1/1027; H04L 27/14
USPC ........................................................ 375/350
See application file for complete search history.

(56) References Cited

U.S. PATENT DOCUMENTS

| 6,384,685 | B1 * | 5/2002 | Juang ................... H03F 3/3023 |
| | | | 330/255 |
| 8,773,202 | B2 * | 7/2014 | Cavallaro ............... H03F 1/308 |
| | | | 330/255 |
| 10,038,404 | B1 * | 7/2018 | Sarais ...................... H03F 1/304 |
| 2009/0289716 | A1 * | 11/2009 | Jaeger .................. H03F 1/0272 |
| | | | 330/261 |
| 2013/0088298 | A1 | 4/2013 | Cavallaro et al. |
| 2013/0127536 | A1 * | 5/2013 | Cavallaro ................. H03F 3/45 |
| | | | 330/260 |
| 2016/0173034 | A1 * | 6/2016 | Lin ........................ H03F 3/187 |
| | | | 330/260 |

OTHER PUBLICATIONS

Babanezhad, J.N., "A Rail-to-Rail CMOS Op Amp", IEEE Journal of Solid-State Circuits, vol. 23, No. 6, Dec. 1988, 4 pages.

* cited by examiner

*Primary Examiner* — Helene E Tayong
(74) *Attorney, Agent, or Firm* — Slater Matsil, LLP (57) ABSTRACT

In an embodiment, a differential amplifier includes: an input stage; an output stage coupled to the input stage, the output stage having first and second output terminals; and a feedback circuit coupled to the output stage, where the feedback circuit is configured to dynamically adjust a bias current of the output stage based on voltages of the first and second output terminals.

23 Claims, 6 Drawing Sheets

| Case | Description | Vpp on antenna ($V_{RF1}$-$V_{RF0}$) | Iin TIA stage | Vout TIA stage | Vout CBPF stage |
|---|---|---|---|---|---|
| A | No signal applied | 0 uV | 0 nA | 0.6 V | 0.6 V |
| B | Minimum (Sensitivity) | 8.9 uV | ±36.8 nA | 0.6 V ± 1.4 mV | 0.6 V ± 5.5 mV |
| C | Maximum (at FS/4) | 178.3 mV | ±1.4 uA | 0.6 V ± 53.8 mV | 0.6 V ± 214 mV |
| D | Maximum (at FS/2) | 355.7 mV | ±2.9 uA | 0.6 V ± 107.35 mV | 0.6 V ± 427 mV |
| E | Saturation (at FS) | 1.26 V | ±4 uA | 0.6 V ± 148.25 mV | 0.6 V ± 0.6 V |

|  | Conventional Class A | Differential amplifier 300 | Conventional class-A extra consumption |
|---|---|---|---|
| quiescent current $I_q$ per output | 100 uA | 22.5 uA | 77.5 uA |
| Total current consumption of amplifier | 222.5 uA | 67.5 uA | 155 uA |
| Total (includes 6 differential amplifiers) | 1.335 mA | 405 uA | About 1 mA |

COMMON-MODE LOOP CONTROLLED FULLY-DIFFERENTIAL ADAPTIVE CLASS-A AMPLIFIER

TECHNICAL FIELD

The present invention relates generally to an electronic system and method, and, in particular embodiments, to a common-mode loop controlled fully-differential adaptive class-A amplifier.

BACKGROUND

More and more electronic devices are being designed for low power consumption. Such electronic devices operate and communicate, typically wirelessly, while maintaining low power consumption. For example, low energy devices, such as sensors, may use Bluetooth Smart, which is a standard that uses frequency shift keying (FSK) and Gaussian FSK (GFSK), for wireless communication.

The amplifiers of the low power devices, therefore, should also be low power. Power amplifiers are classified based on the characteristics of the output stage. In particular, the classes are based on the proportion of each input cycle in which the output device passes current. Conventional class-A amplifiers are simpler than class-B and class-AB amplifiers and use a single amplifying transistor that is biased such that the amplifying transistor is always conducting. For differential class-A amplifiers, the biasing point is selected to be equal to the maximum output current to allow for the amplification of the full range of the input signal. Therefore, conventional class-A amplifiers have high quiescent current.

Conventional class-B amplifiers use two amplifying transistors, each operating for half a cycle, in a push-pull configuration. Because of the non-overlapping of the signals of each amplifying device, the class-B amplifier typically has high crossover distortion.

Conventional class-AB amplifiers have a push-pull configuration that operates for more than half a cycle. To operate, class-AB amplifiers use biasing circuits that are typically more complex than the biasing circuits of class-A or class-B amplifiers. The overlap helps reduce the crossover distortion present in class-B amplifiers at the expense of higher quiescent current. Conventional class-AB amplifiers have lower quiescence current than class-A amplifiers.

SUMMARY

In accordance with an embodiment, a differential amplifier includes: an input stage; an output stage coupled to the input stage, the output stage having first and second output terminals; and a feedback circuit coupled to the output stage, where the feedback circuit is configured to dynamically adjust a bias current of the output stage based on voltages of the first and second output terminals.

In accordance with an embodiment, a method includes: receiving a differential input signal at an input stage of a differential amplifier, generating a differential output signal at an output stage of the differential amplifier based on the differential input signal, and dynamically adjusting a bias current of the output stage based on a common mode voltage of the differential output signal.

In accordance with an embodiment, a radio frequency (RF) receiver including: a low noise amplifier configured to be coupled to an antenna; a mixer circuit coupled to the low noise amplifier; a transimpedance amplifier (TIA) stage coupled to the mixer circuit; a complex bandpass polyphaser filter (CBPF) stage coupled to the TIA stage; and an analog-to-digital converter (ADC) coupled to the CBPF stage, where the TIA stage includes a differential amplifier including: an input stage, an output stage coupled to the input stage, the output stage having first and second output terminals, and a feedback circuit coupled to the output stage, where the feedback circuit is configured to dynamically adjust a bias current of the output stage based on voltages of the first and second output terminals.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

The present invention will be described with respect to embodiments in a specific context, an adaptive class-A amplifier for use in, e.g., a receiver device with, e.g., frequency modulated (FM) signals, such as FSK or GFSK modulation. Embodiments of the present invention may be used in other devices and with other types of signals. For example, some embodiments may be used in low power applications, and applications that would benefit from rail-to-rail outputs and driving of low impedance loads, such as current steering digital-to-analog converters (DACs), reconstruction amplifiers, and transimpedance amplifiers. Embodiments may also be used in devices and circuits that use or could benefit from having an amplifier circuit, such as active filters. Some embodiments may be used in amplifiers other than class-A amplifiers.

In an embodiment of the present invention, a differential amplifier of the A-class dynamically adjusts the output bias currents of the respective output transistors based on a common mode voltage of the output of the differential amplifier. Some embodiments include a common mode feedback loop in the output stage that adjusts the output bias currents based on the differential output of the differential amplifier. By dynamically adjusting the output bias current, low quiescent current is achieved while delivering output currents higher than the quiescent current.

Figures 1, 2:
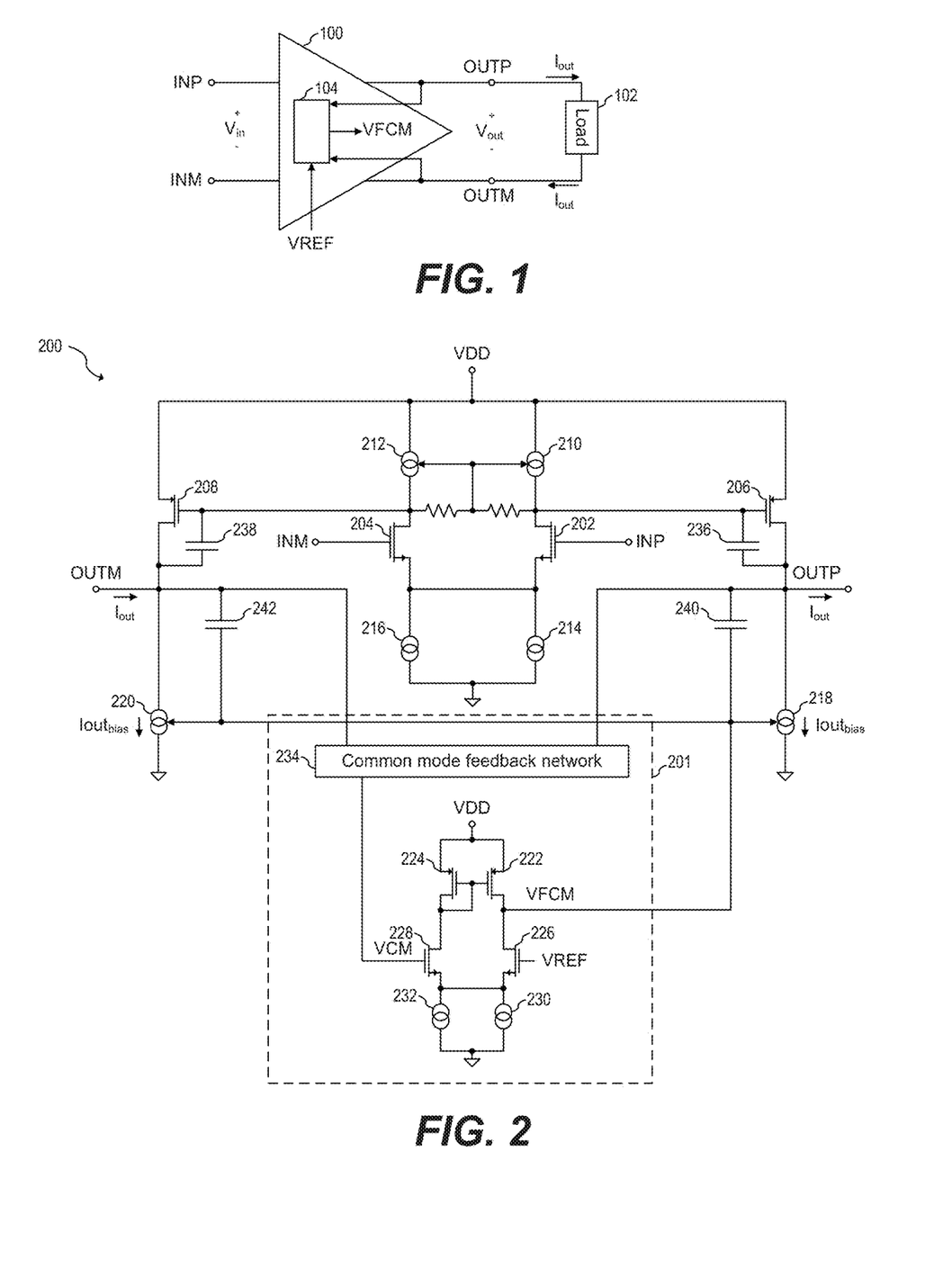
FIG. 1 shows a schematic diagram of a differential amplifier, according to an embodiment of the present invention.
FIG. 2 shows a schematic diagram of a possible implementation of the differential amplifier of FIG. 1, according to an embodiment of the present invention.

FIG. 1 shows a schematic diagram of differential amplifier 100, according to an embodiment of the present invention. Differential amplifier 100 includes differential inputs INP and INM, differential outputs OUTP and OUTM, and common mode feedback loop circuit 104.

During normal operation, differential amplifier 100 receives a differential input signal $V_{in}$ at nodes INP and INM, and produces a differential output signal $V_{out}$ at nodes OUTP and OUTM. As shown in FIG. 1, differential amplifier 100 provides output current $I_{out}$ to load 102 via node OUTP and receives output current $I_{out}$ via node OUTM.

During normal operation, differential amplifier 100 has bias current $Iout_{bias}$ (not shown in FIG. 1) to bias output transistors (not shown in FIG. 1) that are respectively coupled to differential output nodes OUTP and OUTM. In some embodiments, common mode feedback loop circuit 104 monitors voltages $V_{outp}$ and $V_{outm}$ of nodes OUTP and OUTM, respectively, to determine a common mode voltage VCM and adjusts the value of bias current $Iout_{bias}$ based on comparing common mode voltage VCM with reference voltage VREF by using signal VFCM. In some embodiments, Common mode voltage VCM may be given by $$VCM = \frac{V_{outp} + V_{outm}}{2} \quad (1)$$

Reference voltage VREF may be generated inside differential amplifier 100 or outside differential amplifier 100. Some embodiments may generate reference voltage VREF may be generated based on a band-gap circuit. Some embodiments may generate reference voltage VREF using a voltage regulator such as a low voltage dropout regulator (LDO). Other implementations are also possible.

FIG. 2 shows a schematic diagram of differential amplifier 200, according to an embodiment of the present invention. Differential amplifier 200 is a possible implementation of differential amplifier 100. Differential amplifier 200 includes differential inputs INP and INM, differential outputs OUTP and OUTM, common mode feedback loop circuit 201, current sources 210, 212, 214, 216, 218, and 220, capacitors 236, 238, 240, and 242, and transistors 202, 204, 206 and 208. Common mode feedback loop circuit 201 includes common mode feedback network 234, current sources 230 and 232, and transistors 222, and 224. Common mode feedback network 234 generates common mode voltage VCM based on voltages $V_{outp}$ and $V_{outm}$ of nodes OUTP and OUTM, respectively.

During normal operation, differential amplifier 100 receives a differential input signal $V_{in}$ between nodes INP and INM, and produces a differential output signal $V_{out}$ between nodes OUTP and OUTM. When input INP is higher than input INM, transistor 202 becomes more conductive than transistor 204. As a result, transistor 202 pulls down the control node of transistor 206 while current source 212 pulls up the control node of transistor 208. Transistor 206, in turn, becomes more conductive, thereby pulling up voltage $V_{outp}$ at node OUTP, and transistor 208 becomes less conductive, allowing current source 220 to pull down voltage $V_{outm}$ at node OUTM. A similar but opposite behavior is observed when node INM is higher than node INP. Differential amplifier 200 operates in this way when output current $I_{out}$ is lower than output bias current $Iout_{bias}$ and output bias current $Iout_{bias}$ is equal to minimum current $I_q$.

During transient behavior, when output current $I_{out}$ is higher than output bias current $Iout_{bias}$ and output bias current $Iout_{bias}$ is higher than or equal to minimum current $I_q$, current source 220 is unable to sink all of output current $I_{out}$. As a result, voltage $V_{outm}$ at node OUTM increases. As shown, e.g., by Equation 1, since voltage $V_{outm}$ does not decrease in the same proportion as voltage $V_{outp}$ increases, common mode voltage VCM increases. When common mode voltage VCM increases above reference voltage VREF, transistor 228 becomes more conductive than transistor 226. As a result, the voltage of signal VFCM increases, thereby increasing output bias current $Iout_{bias}$ flowing through current sources 218 and 220. Output bias current $Iout_{bias}$ stabilizes (reaches steady state) when it is equal to output current $I_{out}$. When output bias current $Iout_{bias}$ is equal to output current $I_{out}$, current source 220 is able to sink all of output current $I_{out}$, thereby causing common mode voltage VCM to match (i.e., be equal to) reference voltage VREF.

During transient behavior, when output current $I_{out}$ is lower than output bias current $Iout_{bias}$ and output bias current $Iout_{bias}$ is higher than minimum current $I_q$, current source 220 pulls down voltage $V_{outm}$, causing common mode voltage VCM to decrease, resulting in a decrease in the voltage of signal VFCM, which in turn reduces output bias current Iout$_{bias}$. Output bias current Iout$_{bias}$ stabilizes (reaches steady state) when it is equal to output current I$_{out}$ or minimum current I$_q$, whichever is higher.

As described, output bias current Iout$_{bias}$ tracks (i.e., follows) output current I$_{out}$ when output current is higher than minimum current I$_q$, and is equal to minimum current I$_q$ when output current I$_{out}$ is lower than or equal to minimum current I$_q$. In other words, differential amplifier 200 dynamically adjusts output bias current Iout$_{bias}$ when output current I$_{out}$ is higher than minimum current I$_q$ to the minimum current (e.g., equal to output current I$_{out}$) that allows proper delivery of output current I$_{out}$ to load 102.

Advantages of some embodiments include achieving class-A type behavior (e.g., always conducting) while keeping quiescent current low. This is possible by having the biasing current (which may be referred to as the current limit) dynamically track the output current. In other words, some embodiments deliver to the load higher currents that the quiescent current. Since the quiescent current is not tied to the output current, the quiescent current may be adjusted based on amplifier performance instead of output current demands. Some embodiments, therefore, are capable of delivering high output currents and driving low impedance loads while keeping the quiescent current low.

Additional advantages include achieving low quiescent current with a biasing circuit that is less complex than typical biasing circuits of class-AB amplifiers. U.S. Pat. No. 8,773,202 shows an example of a biasing circuit of a class-AB. Some embodiments keep a low quiescent current by avoiding the use of additional biasing branches. Some embodiments are easy to stabilize because of the simplicity of the design.

Transistors 202, 204, 206, 208, 222, and 224 are complementary metal-oxide-semiconductor (CMOS) transistors. In some embodiments, transistors 202, 204, 206, 208, 222, and 224 may be implemented with a different technology, such as bipolar junction transistors (BJT), silicon-germanium (SiGe) transistors, fully-depleted silicon-on-insulator (FD-SOI) CMOS transistors, and fin field-effect transistors (Fin-FETs).

Transistors 202, 204, 226 and 228 are transistors of the n-type, and transistors 206, 208, 222, and 224 are transistors of the p-type. Some embodiments may implement transistors 202, 204, 206, 208, 222, 224, 226 and 228 with a different type. The circuit may be modified to accommodate for the change in transistor type.

Current sources 210, 212, 214, 216, 218, 220, 230 and 232 may be implemented in any way known in the art. For example, some embodiments may implement current sources 210, 212, 214, 216, 218, 220, 230 and 232 with NMOS transistors or PMOS transistors, NPN or PNP bipolar transistors, and resistors.

Common mode feedback network 234 is configured to generate common mode voltage VCM based on voltages V$_{outp}$ and V$_{outm}$. In some embodiments, common mode feedback network 234 generates common mode voltage VCM based on Equation 1. Other embodiments may use a different equation. For example, some embodiments may scale the voltage by a different factor to facilitate comparison with reference voltage VREF.

Common mode feedback network 234 may be implemented with a resistive network. For example, common mode feedback network 234 may include a resistive summing network and a resistive voltage divider. Some embodiments may use active components, such as op-amps or transistors, to implement common mode feedback network 234.

FIG. 2 may also be understood as having a first stage or input stage, and a second stage or output stage. The input stage receives input signal V$_{in}$ and generates an output. The output stage receives the output of the input stage and generates output signal V$_{out}$. The input stage includes transistors 202, 204, and current sources 210, 212, 214, and 216. The output stage includes transistors 206, 208 and current sources 218 and 220. As shown in FIG. 2, common mode feedback loop circuit 201 is implemented in the output stage.

Figure 3A:
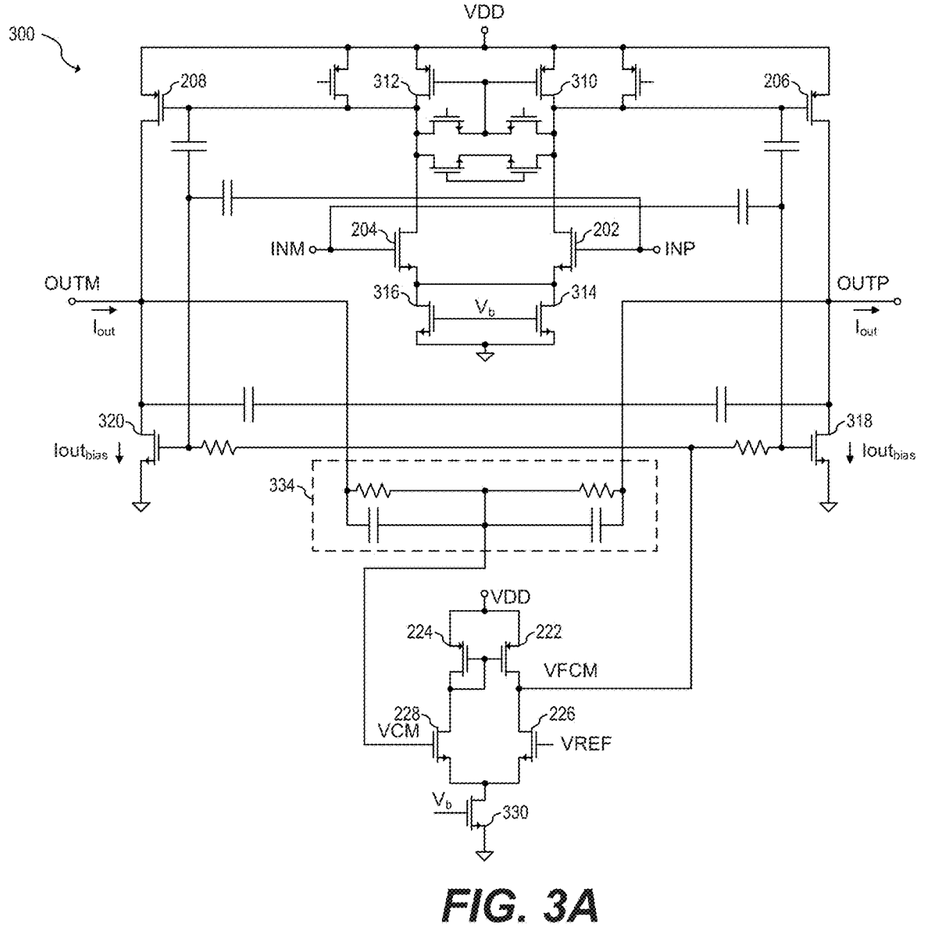
FIG. 3A shows a schematic diagram of another possible implementation of the differential amplifier of FIG. 1, according to an embodiment of the present invention.

FIG. 3A shows a schematic diagram of differential amplifier 300, according to an embodiment of the present invention. Differential amplifier 300 is another possible implementation of differential amplifier 100. As shown by FIG. 3A, differential amplifier 300 implements feedback network 334 with a resistive and capacitive network, and implements current sources 210, 212, 214, 216, 218, 220, 230 and 232 with PMOS transistors 310, 312, and NMOS transistors 314, 316, 318, 320, and 330. Bias voltage V$_b$ biases transistors 314, 316 and 330.

Figure 3B:
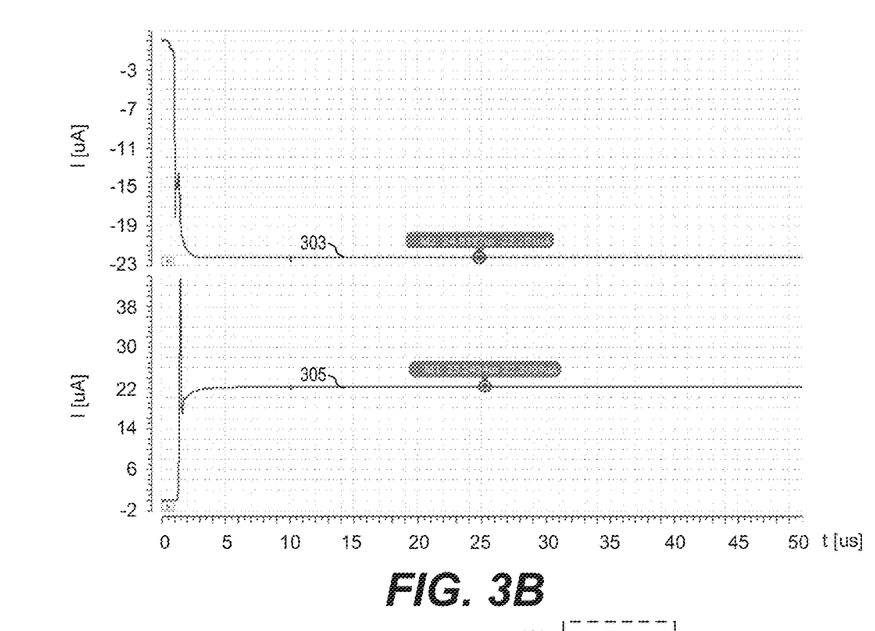
FIG. 3B shows current waveforms of the differential amplifier of FIG. 3A, according to an embodiment of the present invention.

FIG. 3B shows current waveforms of differential amplifier 300, according to an embodiment of the present invention. Curve 303 illustrates the current flowing through transistor 206 when V$_{in}$ is 0 V. Curve 305 illustrates the current flowing through transistor 318 V$_{in}$ is 0 V. As shown by FIG. 3B, after startup and when V$_{in}$ is 0 V, the current flowing through transistor 206 is substantially equal to the current flowing through transistor 318, which is about 22.5 uA. In other words, for this particular embodiment, the minimum current I$_q$ is about 22.5 uA. The total quiescent current of the output devices of the differential amplifier is 45 uA, since minimum current I$_q$ flows through both transistors 318 and 320. Some embodiments may have minimum current I$_q$ lower than 22.5 uA, such as 20 uA, 10 uA, or lower. Some embodiments may have minimum currents I$_q$ higher than 22.5 uA, such as 30 uA, 50 uA, or higher.

Figure 4A:
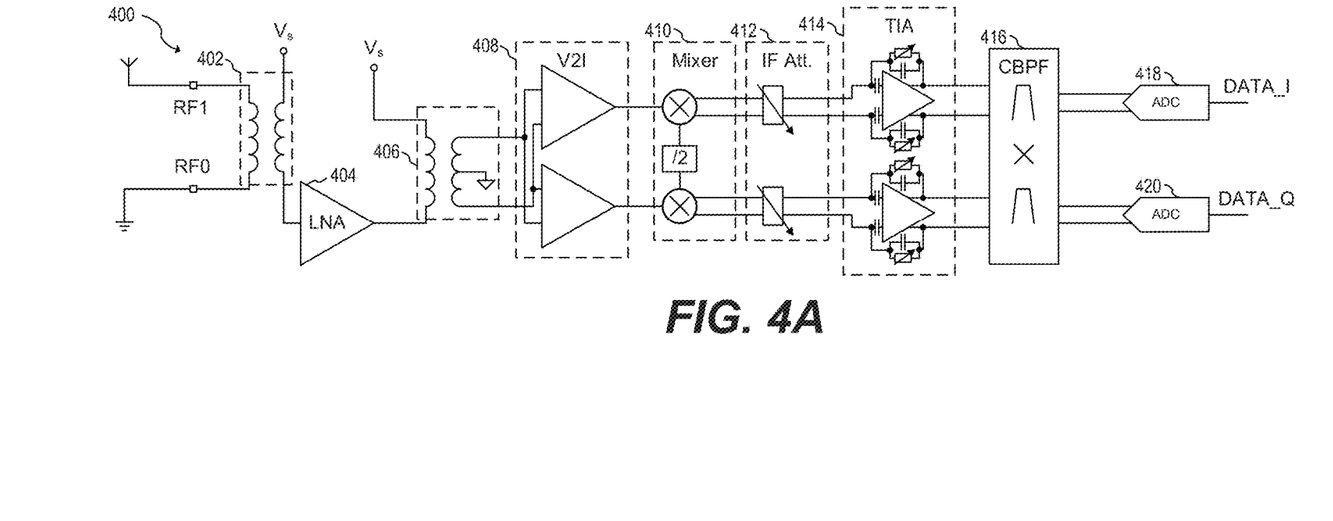
FIG. 4A shows a schematic diagram of portions of a radio frequency (RF) receiver of a Bluetooth Smart transceiver, according to an embodiment of the present invention.

FIG. 4A shows a schematic diagram of portions of radio frequency (RF) receiver 400 of a Bluetooth Smart transceiver, according to an embodiment of the present invention. RF receiver 400 includes transformer 402, low noise amplifier (LNA) 404, balun 406, voltage-to-current converter 408, mixer 410, intermediate frequency (IF) attenuator 412, transimpedance amplifier (TIA) stage 414, complex bandpass polyphaser filter (CBPF) stage 416, and analog-to-digital converters (ADCs) 418 and 420. TIA stage 414 includes two differential amplifiers, such as differential amplifiers 100, 200, or 300. CBPF stage 416 includes four differential amplifiers, such as differential amplifiers 100, 200, or 300. For the purposes of below discussion, it would be assumed that the two differential amplifiers if TIA stage 414 and the four differential amplifiers of CBPF stage 416 of RF receiver 400 are implemented with differential amplifier 300, unless otherwise stated.

Figure 4B:
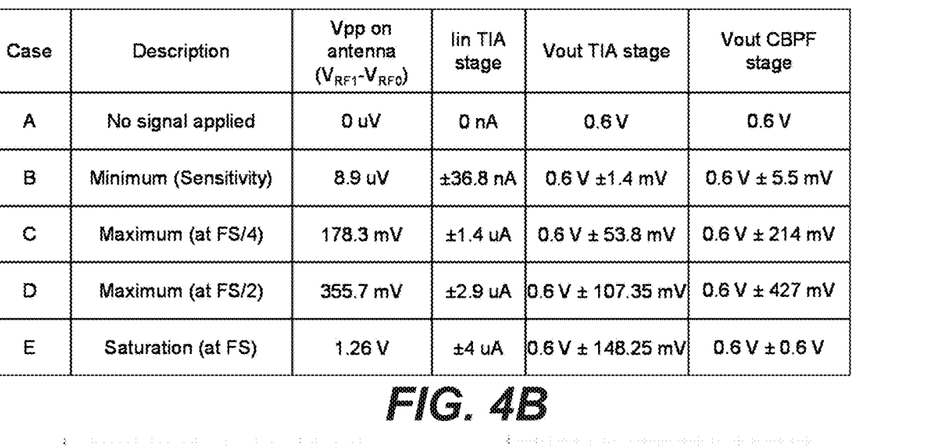
FIG. 4B shows a table with typical voltages and currents of the RF receiver of FIG. 4A, according to an embodiment of the present invention.

FIG. 4B shows a table with typical voltages and currents of RF receiver 400, according to an embodiment of the present invention. The voltages and currents shown in FIG. 4B relate to RF receiver 400 having the two differential amplifiers in TIA stage 414 and the four differential amplifiers in CBPF stage 416 implemented with differential amplifier 300.

FIG. 4B shows voltages for the antenna (V$_{RF1}$-V$_{RF0}$) currents for the input of TIA stage 414, voltages for the output of TIA stage 414, and voltages for the output of CBPF stage 416 for ADCs 418 and 420 (shown in FIG. 4A) input voltage corresponding to full scale (FS), half scale (FS/2), quarter scale (FS/4) and receiver minimum sensitivity.

As shown by FIG. 4B, at minimum sensitivity the peak-to-peak voltage between terminals RF1 and RF0 may be about 8.9 uV. After transformer 402, LNA 404, balun 406, voltage-to-current converter 408, mixer 410, and intermediate frequency (IF) attenuator 412, such voltage results in a current of about ±36.8 nA at the input of TIA stage 414. TIA stage 414 then produces a signal with a common mode voltage VCM of 0.6 V and a peak-to-peak voltage of 1.4 mV, which serves as the input of CBPF stage 416. CBPF stage 416 then produces a signal with common mode voltage VCM of 0.6 V and a peak-to-peak voltage of 5.5 mV.

At full scale, the peak-to-peak voltage between terminals RF1 and RF0 may be about 1.26 V. After transformer 402, LNA 404, balun 406, voltage-to-current converter 408, mixer 410, and intermediate frequency (IF) attenuator 412, such voltage results in a current of about +4 uA at the input of TIA stage 414. TIA stage 414 then produces a signal with a common mode voltage VCM of 0.6 V and a peak-to-peak voltage of 107.35 mV, which serves as the input of CBPF stage 416. CBPF stage 416 then produces a signal with common mode voltage VCM of 0.6 V and a peak-to-peak voltage of 0.6 V.

When no signal is present at the antenna, the outputs of TIA stage 414 and CBPF stage 416 remain at the common mode voltage VCM of 0.6 V.

As shown by FIG. 4B, the differential amplifiers 300 in TIA stage 414 and CBPF stage 416 are capable of operating with a wide range of voltages, from 1.4 mV peak-to-peak at the low end and 0.6 V peak-to-peak on the high end, while still having a quiescent current of about 44 uA. Some embodiments may have a higher or lower quiescent current. The magnitude of the quiescent current will depend on design considerations, such as frequency response, output current capability, etc., manufacturing process, and other variables.

Figure 4C:
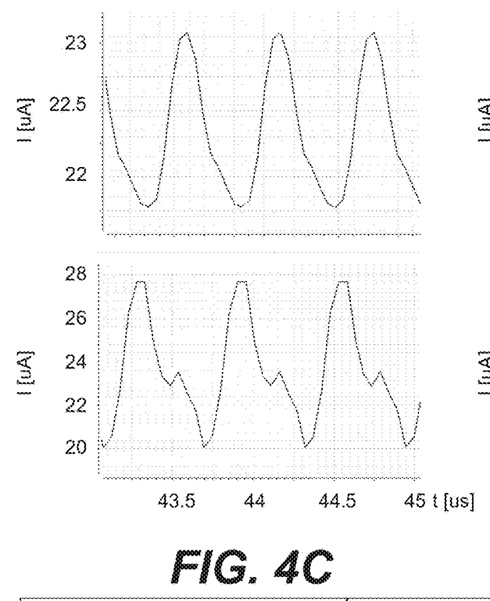
FIGS. 4C and 4D shows voltage waveforms for the output of the TIA stage and CBPF of the RF receiver of FIG. 4A, according to an embodiment of the present invention.
Figure 4D:
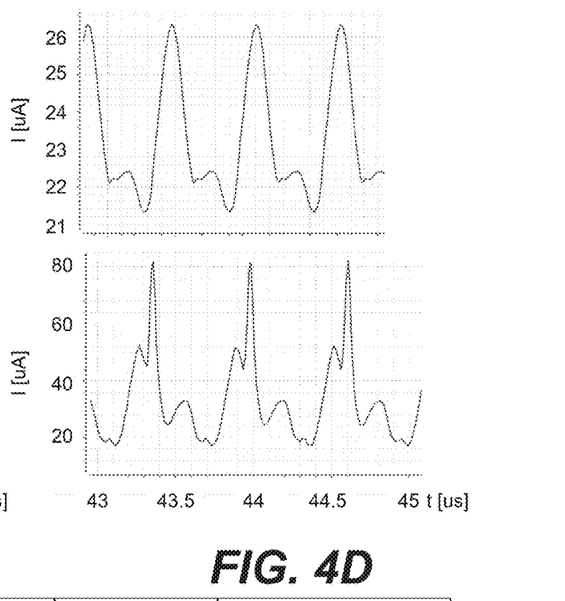

FIGS. 4C and 4D shows voltage waveforms for the output of TIA stage 414 (top) and CBPF (bottom) for quarter scale (FS/4) and full scale (FS), respectively, of RF receiver 400, according to an embodiment of the present invention. As shown by FIGS. 4C and 4D, the frequency content of the outputs of TIA stage 414 and CBPF stage 416 can be extracted for the FS/4 and the FS case. Since a frequency modulation scheme, such as FSK and GFSK used by Bluetooth Smart encodes the information in frequency rather than amplitude, the encoded information can be extracted even in the presence of poor total harmonic distortion (THD).

Figure 4E:
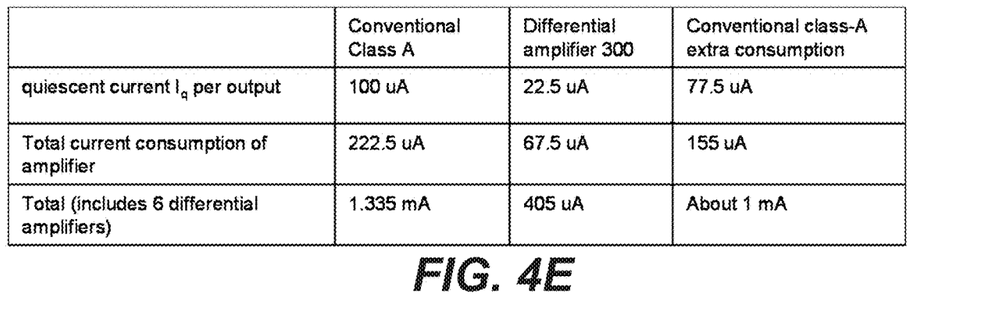
FIG. 4E shows a comparison of quiescent current consumption of the TIA stage and CBPF stage of the RF receiver of FIG. 4A between a conventional class-A differential amplifier implementation and an implementation with the differential amplifier of FIG. 3.

FIG. 4E shows a comparison of quiescent current consumption of TIA stage 414 and CBPF stage 416 between a conventional class-A differential amplifier implementation and the implementation using differential amplifier 300, according to an embodiment of the present invention. As shown by FIG. 4E, using differential amplifier 300 instead of a conventional class-A differential amplifier saves about 1 mA of current, or about 77.5% less quiescent current. Since the total quiescent current consumption of RF receiver 400 may be around 3 mA, a 1 mA savings represents over 30% quiescent current reduction.

Figure 5A:
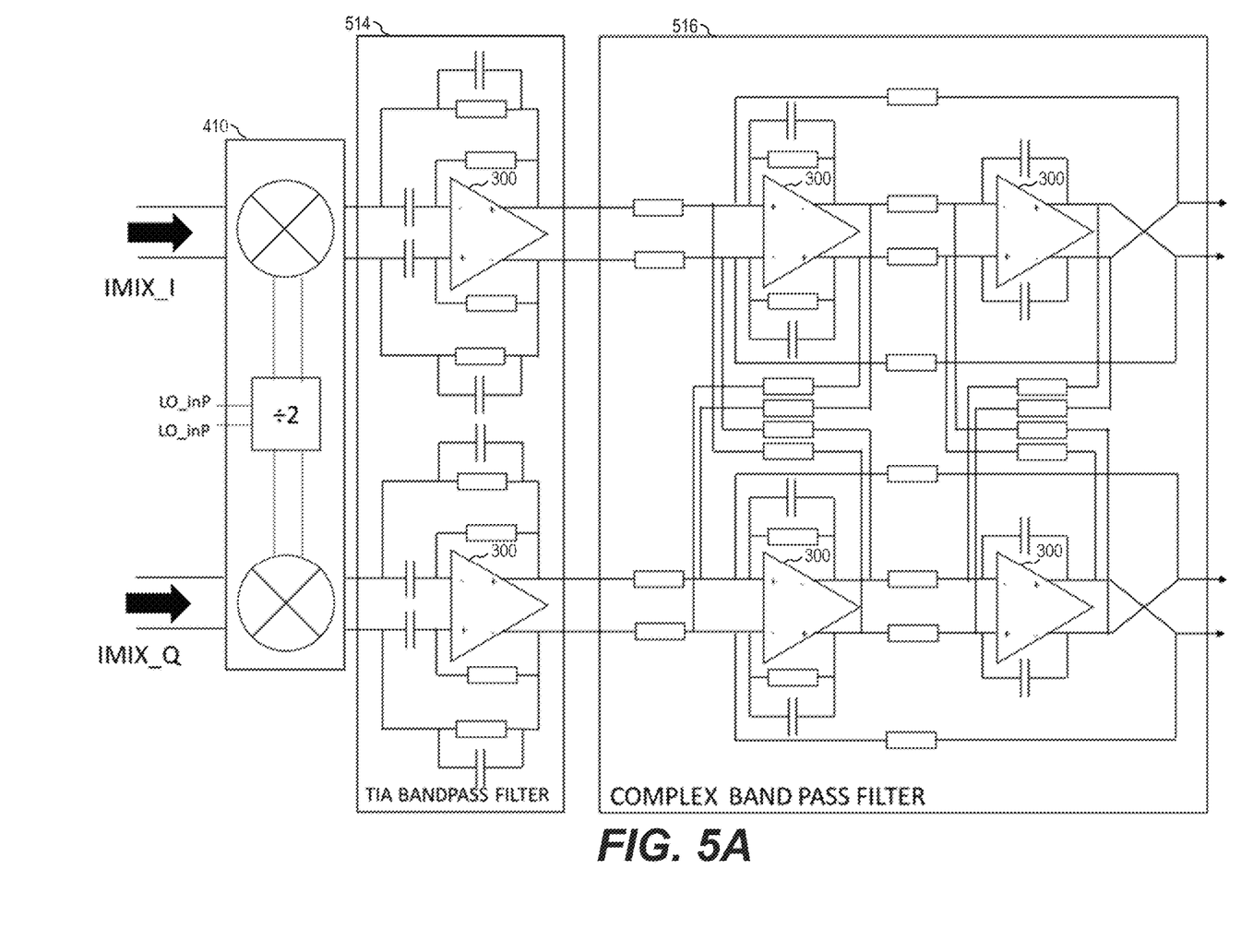
FIG. 5A shows a schematic diagram of a possible implementation of a TIA stage and a CBPF stage of the RF receiver of FIG. 4A, according to an embodiment of the present invention.

FIG. 5A shows a schematic diagram of a possible implementation of TIA stage 414 and CBPF stage 416, according to an embodiment of the present invention. As shown by FIG. 5A, TIA stage 514 is implemented with two differential amplifiers 300, and CBPF stage 516 is implemented with four differential amplifiers 300. Some embodiments may implement the differential amplifiers with differential amplifiers 100 or 200 or a different variant thereof.

During normal operation, mixer 410 receives I-path current IMIX_I and Q-path current IMIX_Q from voltage-to-current converter 408. Mixer 410 generates respective I-path and Q-path mixed currents that are converted into respective I-path and Q-path voltages by TIA stage 514. In some embodiments, the currents are converted by TIA stage 514 via an IF attenuator. TIA stage 514 also provides bandpass filtering. The I-path and Q-path voltages are combined and further bandpass filtered in CBPF stage 516 to generate a voltage for ADCs 418 and 420.

Figure 5B:
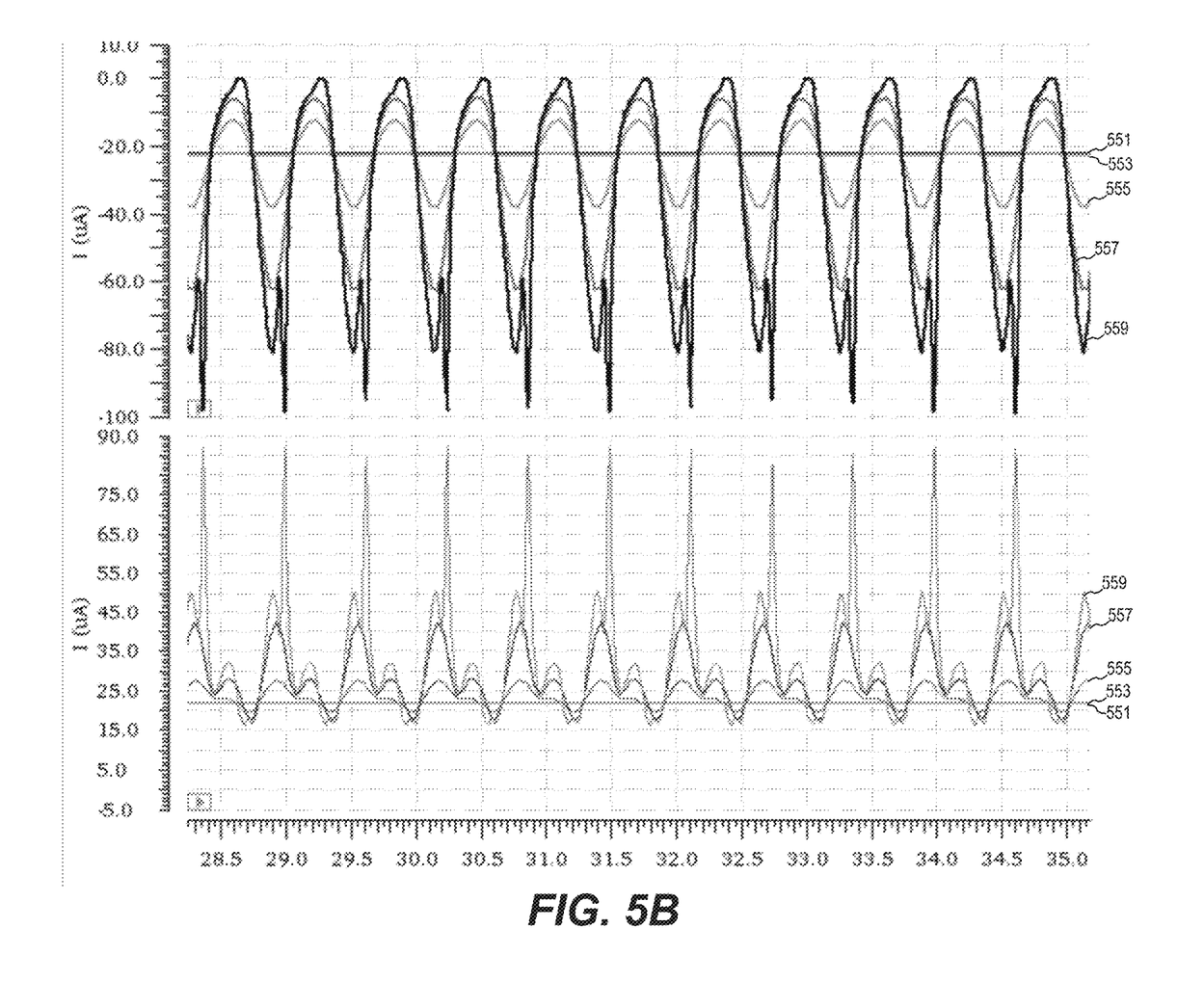
FIG. 5B shows current waveforms of a differential amplifier of the second stage of a CBPF stage of the CBPF stage implementation of FIG. 5A, according to an embodiment of the present invention.

As shown by FIG. 5A, CBPF stage 516 has a first stage of two differential amplifiers 300 and a second stage of two differential amplifiers 300. FIG. 5B shows current waveforms differential amplifier 300 of the second stage of CBPF stage 516, according to an embodiment of the present invention. The top graph shows the current flowing through transistor 206 of differential amplifier 300 of the second stage of CBPF stage 516. The bottom graph shows the current flowing through transistor 318 of differential amplifier 300 of the second stage of CBPF stage 516. Curve 551 corresponds to the case A, B, C, D, and E of FIG. 4B, respectively.

As shown by curve 559, maximum currents, in saturation, flowing though transistors 206 and 318 are about 100 uA, when output bias current $Iout_{bias}$ is 22.5 uA.

As shown by FIG. 5B, differential amplifier 300 is capable of operating over a wide range of input and output voltages while maintaining a low quiescent current.

Example embodiments of the present invention are summarized here. Other embodiments can also be understood from the entirety of the specification and the claims filed herein.

Example 1. A differential amplifier including: an input stage; an output stage coupled to the input stage, the output stage having first and second output terminals; and a feedback circuit coupled to the output stage, where the feedback circuit is configured to dynamically adjust a bias current of the output stage based on voltages of the first and second output terminals.

Example 2. The differential amplifier of example 1, where the output stage further includes: a first output device coupled to the first output terminal; and a second output device coupled to the second output terminal, where the bias current includes a first bias current flowing through the first output device and a second bias current flowing through the second output device.

Example 3. The differential amplifier of one of examples 1 or 2, where the first output device includes a first transistor and the second output device includes a second transistor.

Example 4. The differential amplifier of one of examples 1 to 3, where the output stage further includes a third transistor coupled to the first transistor, and a fourth transistor coupled to the second transistor, and where the feedback circuit adjusts the first bias current and the second bias current by controlling control terminals of the second and fourth transistors.

Example 5. The differential amplifier of one of examples 1 to 4, where the first transistor and the second transistor are p-type transistors, and where the second transistor and the fourth transistor are n-type transistors.

Example 6. The differential amplifier of one of examples 1 to 5, where the feedback circuit is configured to increase the bias current when a common mode voltage at the first and second output terminals increases.

Example 7. The differential amplifier of one of examples 1 to 6, where the feedback circuit is configured to increase the bias current when a common mode voltage at the first and second output terminals is greater than a reference voltage.

Example 8. The differential amplifier of one of examples 1 to 7, where the output stage is configured to deliver an output current to a load, and where the feedback circuit is configured to increase the bias current when an output current flowing through the load is greater than a quiescent current.

Example 9. The differential amplifier of one of examples 1 to 8, where the quiescent current is a current flowing through an output device of the output stage when the output current is 0 A.

Example 10. The differential amplifier of one of examples 1 to 9, where the quiescent current is lower than 25% of a maximum output current.

Example 11. The differential amplifier of one of examples 1 to 10, where the feedback circuit includes: a resistive network configured to generate a first voltage; and a comparator circuit configured to compare the first voltage with a reference voltage, and generate a first output based on the comparison, the first output configured to control the bias current.

Example 12. The differential amplifier of one of examples 1 to 11, where the resistive network includes capacitors.

Example 13. The differential amplifier of one of examples 1 to 12, where the feedback circuit generates the first voltage according to $$V1 = \frac{V_{outp} + V_{outm}}{2},$$

where V1 is the first voltage, $V_{outp}$ is a voltage at the first output terminal, and $V_{outm}$ is a voltage at the second output terminal.

Example 14. A method including: receiving a differential input signal at an input stage of a differential amplifier; generating a differential output signal at an output stage of the differential amplifier based on the differential input signal; and dynamically adjusting a bias current of the output stage based on a common mode voltage of the differential output signal.

Example 15. The method of example 14, where the bias current includes a first bias current flowing through a first transistor coupled to a first output device of the output stage, the first output device coupled to a first output terminal, and a second bias current flowing through a second transistor coupled to a second output device of the output stage, the second output device coupled to a second output terminal, and where dynamically adjusting the bias current includes controlling control terminals of the first and second transistors.

Example 16. The method of one of examples 14 or 15, where dynamically adjusting the bias current includes increasing the bias current when the common mode voltage increases.

Example 17. The method of one of examples 14 to 16, where dynamically adjusting the bias current includes: comparing the common mode voltage with a reference voltage; and increasing the bias current when the common mode voltage is higher than the reference voltage.

Example 18. The method of one of examples 14 to 17, further including delivering an output current to a load, where dynamically adjusting the bias current includes increasing the bias current when the output current is higher than a quiescent current.

Example 19. The method of one of examples 14 to 18, where the quiescent current is a current flowing through an output device of the output stage when the output current is 0 A.

Example 20. The method of one of examples 14 to 19, where the quiescent current is lower than 25% of a maximum output current.

Example 21. A radio frequency (RF) receiver including: a low noise amplifier configured to be coupled to an antenna; a mixer circuit coupled to the low noise amplifier; a transimpedance amplifier (TIA) stage coupled to the mixer circuit; a complex bandpass polyphaser filter (CBPF) stage coupled to the TIA stage; and an analog-to-digital converter (ADC) coupled to the CBPF stage, where the TIA stage includes a differential amplifier including: an input stage, an output stage coupled to the input stage, the output stage having first and second output terminals, and a feedback circuit coupled to the output stage, where the feedback circuit is configured to dynamically adjust a bias current of the output stage based on voltages of the first and second output terminals.

Example 22. The RF receiver of example 21, where the RF receiver is configured to receive frequency modulated signals from the antenna.

Example 23. The RF receiver of one of examples 21 or 22, where the frequency modulated signals are frequency shift keying (FSK) or Gaussian FSK (GFSK) signals.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A differential amplifier comprising:
an input stage;
an output stage coupled to the input stage, the output stage having first and second output terminals; and
a feedback circuit coupled to the output stage, wherein the feedback circuit is configured to dynamically adjust a bias current of the output stage based on voltages of the first and second output terminals, wherein the output stage further comprises:
a first output device coupled to the first output terminal, and
a second output device coupled to the second output terminal, wherein the bias current comprises a first bias current flowing through the first output device and a second bias current flowing through the second output device.

2. The differential amplifier of claim 1, wherein the first output device comprises a first transistor and the second output device comprises a second transistor.

3. The differential amplifier of claim 2, wherein the output stage further comprises a third transistor coupled to the first transistor, and a fourth transistor coupled to the second transistor, and wherein the feedback circuit adjusts the first bias current and the second bias current by controlling control terminals of the second and fourth transistors.

4. The differential amplifier of claim 3, wherein the first transistor and the second transistor are p-type transistors, and wherein the third transistor and the fourth transistor are n-type transistors.

5. The differential amplifier of claim 1, wherein the feedback circuit is configured to increase the bias current when a common mode voltage at the first and second output terminals is greater than a reference voltage.

6. The differential amplifier of claim 1, wherein the output stage is configured to deliver an output current to a load, and wherein the feedback circuit is configured to increase the bias current when an output current flowing through the load is greater than a quiescent current.

7. The differential amplifier of claim 6, wherein the quiescent current is a current flowing through an output device of the output stage when the output current is about zero amperes.

8. The differential amplifier of claim 6, wherein the quiescent current is lower than 25% of a maximum output current.

9. The differential amplifier of claim 1, wherein the feedback circuit comprises:
    a resistive network configured to generate a first voltage; and
    a comparator circuit configured to compare the first voltage with a reference voltage, and generate a first output based on the comparison, the first output configured to control the bias current.

10. The differential amplifier of claim 9, wherein the resistive network comprises capacitors.

11. The differential amplifier of claim 9, wherein the feedback circuit generates the first voltage according to $$V1 = \frac{V_{outp} + V_{outm}}{2},$$

wherein V1 is the first voltage, $V_{outp}$ is a voltage at the first output terminal, and $V_{outm}$ is a voltage at the second output terminal.

12. A differential amplifier comprising:
    an input stage;
    an output stage coupled to the input stage, the output stage having first and second output terminals; and
    a feedback circuit coupled to the output stage, wherein the feedback circuit is configured to dynamically adjust a bias current of the output stage based on voltages of the first and second output terminals, wherein the feedback circuit is configured to increase the bias current when a common mode voltage at the first and second output terminals increases, wherein the feedback circuit comprises:
        a resistive network configured to generate a first voltage; and
        a comparator circuit configured to compare the first voltage with a reference voltage, and generate a first output based on the comparison, the first output configured to control the bias current.

13. The differential amplifier of claim 12, wherein the output stage further comprises a first transistor coupled to the first output terminal, and a second transistor coupled to the second output terminal, and wherein the bias current comprises a first bias current flowing through the first transistor and a second bias current flowing through the second transistor.

14. A method comprising:
    receiving a differential input signal at an input stage of a differential amplifier;
    generating a differential output signal at an output stage of the differential amplifier based on the differential input signal; and
    dynamically adjusting a bias current of the output stage based on a common mode voltage of the differential output signal, wherein the bias current comprises a first bias current flowing through a first transistor coupled to a first output device of the output stage, the first output device coupled to a first output terminal, and a second bias current flowing through a second transistor coupled to a second output device of the output stage, the second output device coupled to a second output terminal, and wherein dynamically adjusting the bias current comprises controlling control terminals of the first and second transistors.

15. The method of claim 14, wherein dynamically adjusting the bias current comprises:
    comparing the common mode voltage with a reference voltage; and
    increasing the bias current when the common mode voltage is higher than the reference voltage.

16. The method of claim 14, further comprising delivering an output current to a load, wherein dynamically adjusting the bias current comprises increasing the bias current when the output current is higher than a quiescent current.

17. The method of claim 16, wherein the quiescent current is a current flowing through an output device of the output stage when the output current is about zero amperes.

18. The method of claim 16, wherein the quiescent current is lower than 25% of a maximum output current.

19. A method comprising:
    receiving a differential input signal at an input stage of a differential amplifier;
    generating a differential output signal at an output stage of the differential amplifier based on the differential input signal; and
    dynamically adjusting a bias current of the output stage based on a common mode voltage of the differential output signal, wherein dynamically adjusting the bias current comprises increasing the bias current when the common mode voltage increases.

20. A radio frequency (RF) receiver comprising:
    a low noise amplifier configured to be coupled to an antenna;
    a mixer circuit coupled to the low noise amplifier;
    a transimpedance amplifier (TIA) stage coupled to the mixer circuit;
    a complex bandpass polyphaser filter (CBPF) stage coupled to the TIA stage; and
    an analog-to-digital converter (ADC) coupled to the CBPF stage, wherein the TIA stage comprises a differential amplifier comprising:
        an input stage,
        an output stage coupled to the input stage, the output stage having first and second output terminals, and
        a feedback circuit coupled to the output stage, wherein the feedback circuit is configured to dynamically adjust a bias current of the output stage based on voltages of the first and second output terminals.

21. The RF receiver of claim 20, wherein the RF receiver is configured to receive frequency modulated signals from the antenna.

22. The RF receiver of claim 21, wherein the frequency modulated signals are frequency shift keying (FSK) or Gaussian FSK (GFSK) signals.

23. The RF receiver of claim 20, wherein the feedback circuit is configured to increase the bias current when a common mode voltage at the first and second output terminals increases.

* * * * *